United States Patent
Shinozaki

(10) Patent No.: US 6,464,825 B1
(45) Date of Patent: Oct. 15, 2002

(54) SUBSTRATE PROCESSING APPARATUS INCLUDING A MAGNETICALLY LEVITATED AND ROTATED SUBSTRATE HOLDER

(75) Inventor: Hiroyuki Shinozaki, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 39 days.

(21) Appl. No.: 09/593,709

(22) Filed: Jun. 15, 2000

(30) Foreign Application Priority Data

Jun. 15, 1999 (JP) .......................... 11-168285

(51) Int. Cl.$^7$ .............................................. H01L 21/00
(52) U.S. Cl. ................... 156/345.55; 118/724; 118/729
(58) Field of Search .................... 118/724, 729; 156/345

(56) References Cited

U.S. PATENT DOCUMENTS

| | | |
|---|---|---|
| 5,273,588 | 12/1993 | Foster et al. |
| 5,683,518 | 11/1997 | Moore et al. |
| 5,795,448 * | 8/1998 | Hurwitt et al. ........... 204/192.1 |
| 5,879,128 * | 3/1999 | Tietz et al. .................. 414/757 |
| 6,022,413 * | 2/2000 | Shinozki et al. ............ 118/715 |
| 6,111,225 * | 8/2000 | Ohkase et al. ............... 219/390 |

FOREIGN PATENT DOCUMENTS

| | | |
|---|---|---|
| JP | 404177720 A * | 6/1992 |
| JP | 4-348023 | 12/1992 |
| JP | 5-70287 | 3/1993 |
| JP | 5-152207 | 6/1993 |
| JP | 7-58036 | 3/1995 |
| JP | 7-273053 | 10/1995 |
| JP | 8-255792 | 10/1996 |
| JP | 0 748 881 | 12/1996 |
| JP | 9-3648 | 1/1997 |
| JP | 9-3649 | 1/1997 |
| JP | 9-3650 | 1/1997 |
| JP | 9-31656 | 2/1997 |
| JP | 9-53181 | 2/1997 |

\* cited by examiner

Primary Examiner—Marian C. Knode
Assistant Examiner—Michelle Crowell
(74) Attorney, Agent, or Firm—Wenderoth, Lind & Ponack, L.L.P.

(57) ABSTRACT

A substrate processing apparatus includes a substrate processing chamber; a mechanism for long and unloading a substrate into and out of the chamber; a substrate heating source provided in the chamber; and a raw material supply source for supplying a raw material toward the substrate for processing. During processing of the substrate, the raw material for processing is supplied from a surface facing a surface of the substrate to be processed. When the substrate and a holder on which the substrate is placed are moved to a predetermined position for processing in the substrate processing chamber, a space in the substrate processing chamber is divided by the substrate into an upper space serving as a reaction space for processing and a lower space where the substrate heating source, etc. are placed. The apparatus also includes a magnetic force source for holding the holder at the predetermined position in a levitational manner by a magnetic force during processing of the substrate.

13 Claims, 8 Drawing Sheets

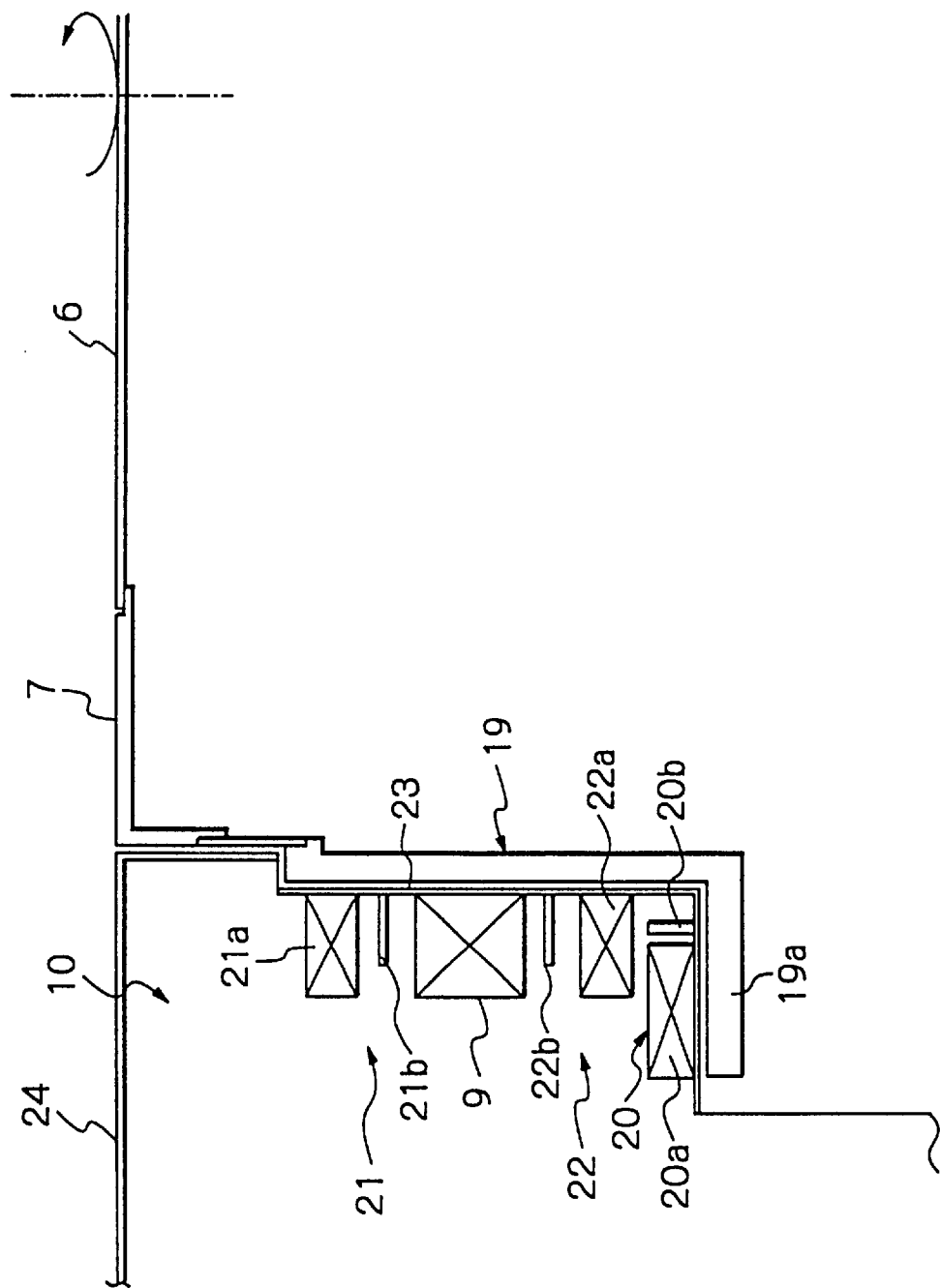

SUBSTRATE PROCESSING APPARATUS INCLUDING A MAGNETICALLY LEVITATED AND ROTATED SUBSTRATE HOLDER

BACKGROUND OF THE INVENTION

The present invention relates to a substrate processing apparatus of a single-substrate processing type used in a semiconductor manufacturing process, such as a single-substrate processing type CVD system for forming a thin film on a substrate, or a single-substrate processing type etcher system for thinly removing the surface of a substrate.

A conventional substrate processing apparatus of the type described above is required to carry out processing in a space containing a minimum amount of dust and a minimum number of Na ions, K ions, etc. liberated from the human body and the atmosphere because it is used to form fine electronic circuits on a substrate. To obtain a space containing a minimum number of Na ions, K ions, etc., a conventional substrate processing apparatus comprises a series of chambers as shown in FIGS. 1, 2 and 3.

FIG. 1 is a diagram showing a typical structural example of a conventional substrate processing apparatus for single-substrate processing. In the substrate processing apparatus, first, a gate valve 101 is opened to load a substrate to be processed into a load-unload chamber 102. Upon completion of the loading, the gate valve 101 is closed, and the load-unload chamber 102 is evacuated. A robot chamber 103 is held under a vacuum at all times. After a pressure in the load-unload chamber 102 has reached a predetermined level of vacuum, a gate valve 104 between the load-unload chamber 102 and the robot chamber 103 is opened, and the substrate is taken out of the load-unload chamber 102 and moved into the robot chamber 103 by means of a robot installed in the robot chamber 103.

Thereafter, the gate valve 104 between the robot chamber 103 and the load-unload chamber 102 is closed. Next, a gate valve 106 provided between a processing chamber 105 and the robot chamber 103 is opened. Then, the arm of the robot is extended to load the substrate into the processing chamber 105. A heater (e.g. a lamp heater 108) as a reaction energy source is provided below the substrate 107 loaded into the processing chamber 105. The lamp heater 108 is arranged to face the substrate 107 through a transparent quartz plate 109. The substrate 107 may be placed directly on a resistance heater, as is very often the case. A processing gas supply unit 112 is provided above the substrate 107 to supply a raw material for processing and a carrier gas G toward the substrate 107. The apparatus is further provided with exhaust systems 110 for controlling the pressure in the processing chamber 105. It should be noted that reference numeral 111 denotes a power supply unit for supplying electric power to the lamp heater 108.

FIG. 2 is a diagram showing a structural example of a further improved conventional substrate processing apparatus. In this example, a processing chamber 105 devised to smooth the flow of the raw material and carrier gas G supplied from the processing gas supply unit 112 is provided. When the substrate 107 reaches the processing position as shown, a processing space is formed in the center of the processing chamber 105 by the substrate 107, a smoothly rounded chamber wall and the processing gas supply unit 112. In FIG. 2, reference numeral 113 denotes a bellows, and reference numeral 114 denotes an elevating shaft. The elevating shaft 114 is raised and lowered by an elevating mechanism (not shown) to move the lamp heater 108 and the transparent quartz plate 109 up and down, which are mounted on the upper end of the elevating shaft 114. It should be noted that the gate valves and other members that would adversely affect gas flow and temperature control of the chamber wall are excluded from the processing chamber 105.

FIG. 3 shows an example of further improved conventional substrate processing apparatus. In this apparatus, when the substrate 107 placed on a holder 115 reaches a processing position by means of a holder elevating mechanism 116, the internal space of the processing chamber 105 is separated into two spaces, i.e., a processing space (space A) and a space containing a heat source, a transfer mechanism, etc. (space B). Accordingly, in the space A, a gas flow system can be readily designed primarily taking into consideration processing. Since the space B is isolated from the processing gas, the transparent quartz plate 109 is not subject to fogging and it is, therefore, possible to perform stable heating with the lamp heater 108. Even if a complicated mechanism of the apparatus exists in the space B, since no surface of the mechanism comes into contact with the processing gas, any surface which may generate particles or ions is minimized.

In the above-described examples of a substrate processing apparatus shown in FIGS. 1 to 3, a processing gas supply source of the processing gas supply unit 112 is disposed on the upper side with respect to the substrate 107, and the lamp heater 108 as a heat source is disposed on the lower side with respect to the substrate 107. The advantages and disadvantages of this arrangement will be described below with reference to FIGS. 4 and 5. FIG. 4 shows a structural example in which the processing gas supply source 112 is disposed on the upper side, and the heat source 117 is disposed on the lower side. The advantage of this substrate processing apparatus is that in a gravitational space it is only necessary to place the substrate 107 on a holder, and there is no need to provide a special jig for fixing the substrate 107 on the holder. The disadvantage of this apparatus is that heat convection 118 is generated from the heat source 117 toward the processing gas supply source 112, and it is therefore difficult for the processing gas (reaction precursor) 119 emitted from the processing gas supply source 112 to reach the surface of the substrate 107 smoothly.

FIG. 5 shows a structural example in which the processing gas supply source 112 is disposed on the lower side and the heat source 117 is disposed on the upper side in reverse positional relation to the arrangement shown in FIG. 4. The advantage of this substrate processing apparatus is that since the surface of the substrate 107 to be processed faces downward, there is no likelihood that the surface to be processed will be contaminated with falling particles. The disadvantage of the substrate processing apparatus is that a mechanism is required for turning the substrate 107 upside down and a jig 120 is required for retaining the substrate 107 on a holder. The provision of the substrate retaining jig 120 is particularly disadvantageous from the viewpoint of processing performance because it is located on the processing side.

To solve the above-described problems, there has been proposed a processing chamber structure arranged as shown in FIG. 6. In the illustrated arrangement, the processing gas supply source 112 is disposed on the upper side with respect to the substrate 107, and the heat source 117 is disposed on the lower side with respect to the substrate 107. The substrate 107 is simply placed on the holder 115. With this arrangement, heat convection problems can be solved by rotating the substrate 107 about the center axis thereof. That is, rotating the substrate 107 produces a flow of processing gas 125 flowing from the processing gas supply source 112 toward the substrate 107 and further to the periphery thereof. Thus, the processing gas flow 125 is unaffected by the heat convection and the processing gas is efficiently supplied to the surface of the substrate 107, the processing gas is also thereby efficiently discharged in each sideward direction.

In FIG. 6, reference numeral 115 denotes a holder for holding the substrate 107. The holder 115 is mounted on the top surface of a rotary table 121. The rotary table 121 is rotatably supported on a stationary side 126 via bearings 122. A rotational drive source 123 is provided on the stationary side 126. A rotary target 124 is provided on the outer peripheral surface of the rotary table 121. The rotary table 121 is rotated by a rotating magnetic force transmitted from the rotational drive source 123 to the rotary target 124.

If the substrate processing chamber is arranged as shown in FIG. 6, the above-described advantage, i.e., smooth supply of the processing gas to the surface of the substrate 7 is provided. However, it is necessary in order to replace the rotary table 121, which is a rotary member on which the holder 115 is mounted, to suspend and disassemble the apparatus. To avoid disassembling of the apparatus, the rotary table 121 is designed to have a long working life, and a cleaning operation is carried out to remove deposits from the rotary table without disassembling it. However, deterioration of the apparatus components caused by use of a cleaning gas during the cleaning operation becomes problematic.

It should be noted that substrate processing apparatuses in which a substrate is rotated are disclosed in Japanese Patent Application Unexamined Publication (KOKAI) Nos. 5-152207 and 7-58036. The apparatuses, however, suffer from disadvantages similar to those referred to with regard to the apparatus shown in FIG. 6.

SUMMARY OF THE INVENTION

In view of the above-described circumstances, an object of the present invention is to provide a substrate processing apparatus which takes advantage of the arrangement in which a processing gas supply source is disposed on an upper side, and a heat source is disposed on a lower side. The apparatus enables a processing gas to reach the surface of the substrate smoothly by eliminating a problem whereby it is difficult for a processing gas to reach a substrate surface efficiently due to the influence of heat convection. In addition, the apparatus allows replacement of a holder for holding the substrate and a rotary member for supporting the holder without the need for disassembling the substrate processing chamber.

To solve the above-described problems, according to a first aspect of the invention, a substrate processing apparatus is provided which includes a substrate processing chamber, a mechanism for loading and unloading a substrate into and out of the substrate processing chamber, a substrate heating source provided in the chamber, and a raw material supply source for supplying a raw material for processing. During processing of the substrate, the raw material for processing is supplied from a surface facing a surface of the substrate to be processed. When the substrate and a holder on which the substrate is placed are moved to a predetermined position for processing in the substrate processing chamber, the space in the substrate processing chamber is divided by the substrate into an upper space serving as a reaction space for processing and a lower space where the substrate heating source, etc. are placed. The substrate processing apparatus is characterized by including a magnetic force source for holding the holder at the predetermined position in a levitational manner by a magnetic force during processing of the substrate.

In this invention, as stated above, when a substrate is processed in a reaction space where a processing gas is present under a vacuum such as exists in the substrate processing chamber, the substrate is levitated by a magnetic force during processing. Consequently, the apparatus is not subject to particle contamination. In addition, because the holder is held or released according to whether or not there is a magnetic force from the magnetic force source, it becomes easy to perform the operation of holding or releasing the holder, and it also becomes easy to load and unload the substrate into and from the substrate processing chamber. Accordingly, it becomes easy to carry out replacement of the holder and cleaning to remove a deposit on the substrate, etc.

According to a second aspect of the invention, in the substrate processing apparatus according to the first aspect, the holder is rotated about the center axis of the substrate by the magnetic force source.

As stated above, the holder is levitated and rotated by means of the magnetic force source. Consequently, a pumping effect is caused on the surface of the substrate by the rotation of the holder, which allows the flow of processing gas to descend toward the substrate and overcome the ascending current (heat convection) produced by heating. Accordingly, the processing gas reaches the substrate surface smoothly.

According to a third aspect of the invention, in the substrate processing apparatus according to the first or second aspect, the holder is supported by an annular magnetic levitating member. The magnetic levitating member is magnetically coupled to the magnetic force source only when the holder is moved to the predetermined position for processing of the substrate.

As stated above, only when the magnetic levitating member is carried to the predetermined position for processing of the substrate, the magnetic levitating member supporting the holder is magnetically coupled to the magnetic force source. Therefore, when processing is not freely move into or out of the substrate processing chamber. Accordingly, substrate loading-unloading, cleaning and replacement of the holder and the levitating member can all be readily performed.

According to a fourth aspect of the invention, in the substrate processing apparatus according to the third aspect, the magnetic force source includes a magnetic bearing and a rotational drive source, and the magnetic levitating member is supported in a levitational manner by the magnetic bearings and caused to rotate by a magnetic force generated by the rotational drive source.

As stated above, the magnetic levitating member is supported in a levitational manner by the magnetic bearing and rotated by the rotational drive source. Therefore, it is possible to stably perform levitational support control and rotation control of the magnetic levitating member, and even the latter has a large diameter and rotates at a high peripheral speed.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 9 is a diagram or vertical view showing partially in section a structural example of a mechanism for holding and rotating a holder of the substrate processing apparatus according to an another embodiment of the present invention.

DETAILED DESCRIPTION OF THE INVENTION

Preferred embodiments of the present invention will be described below with reference to the accompanying drawings.

Figure 1:
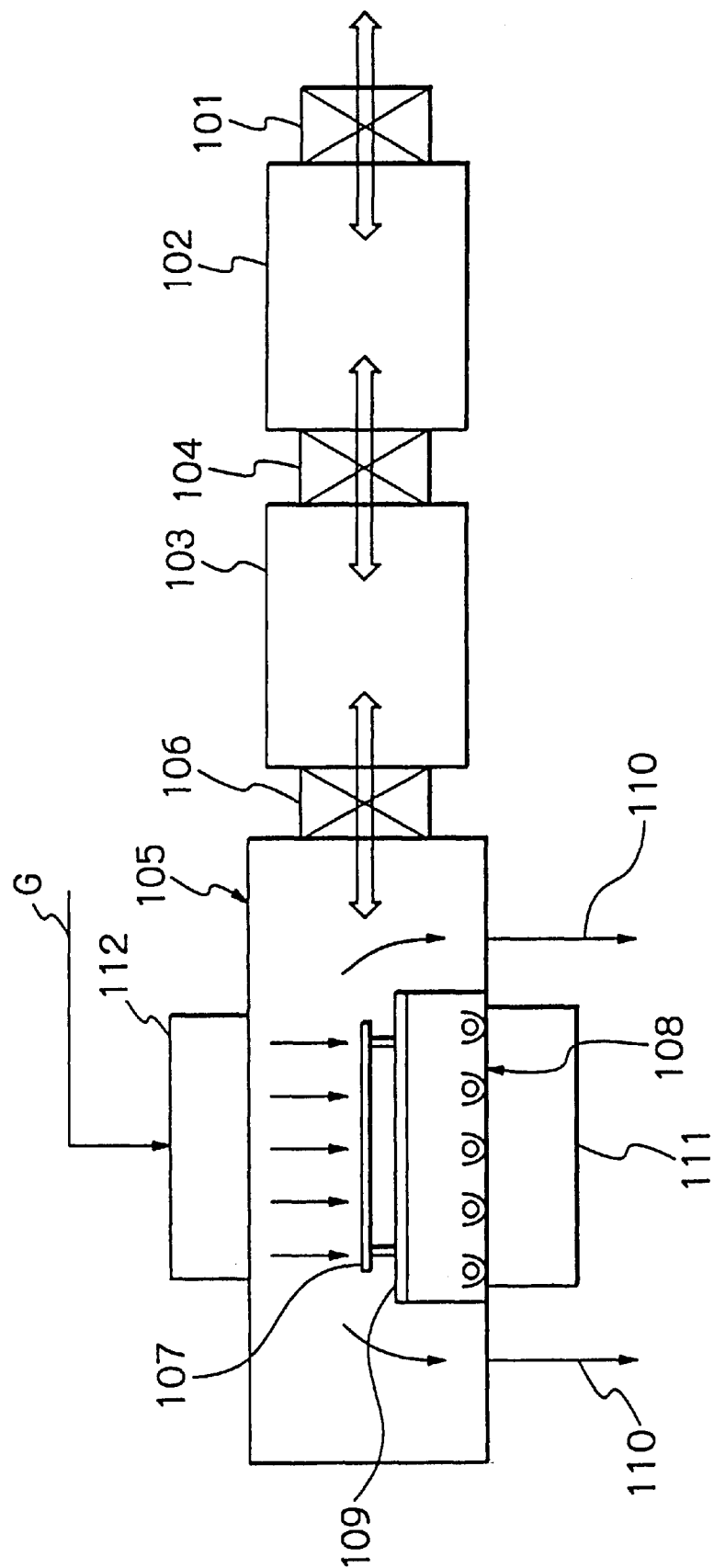
FIG. 1 is a diagram showing a structural example of a conventional substrate processing apparatus.
Figure 2:
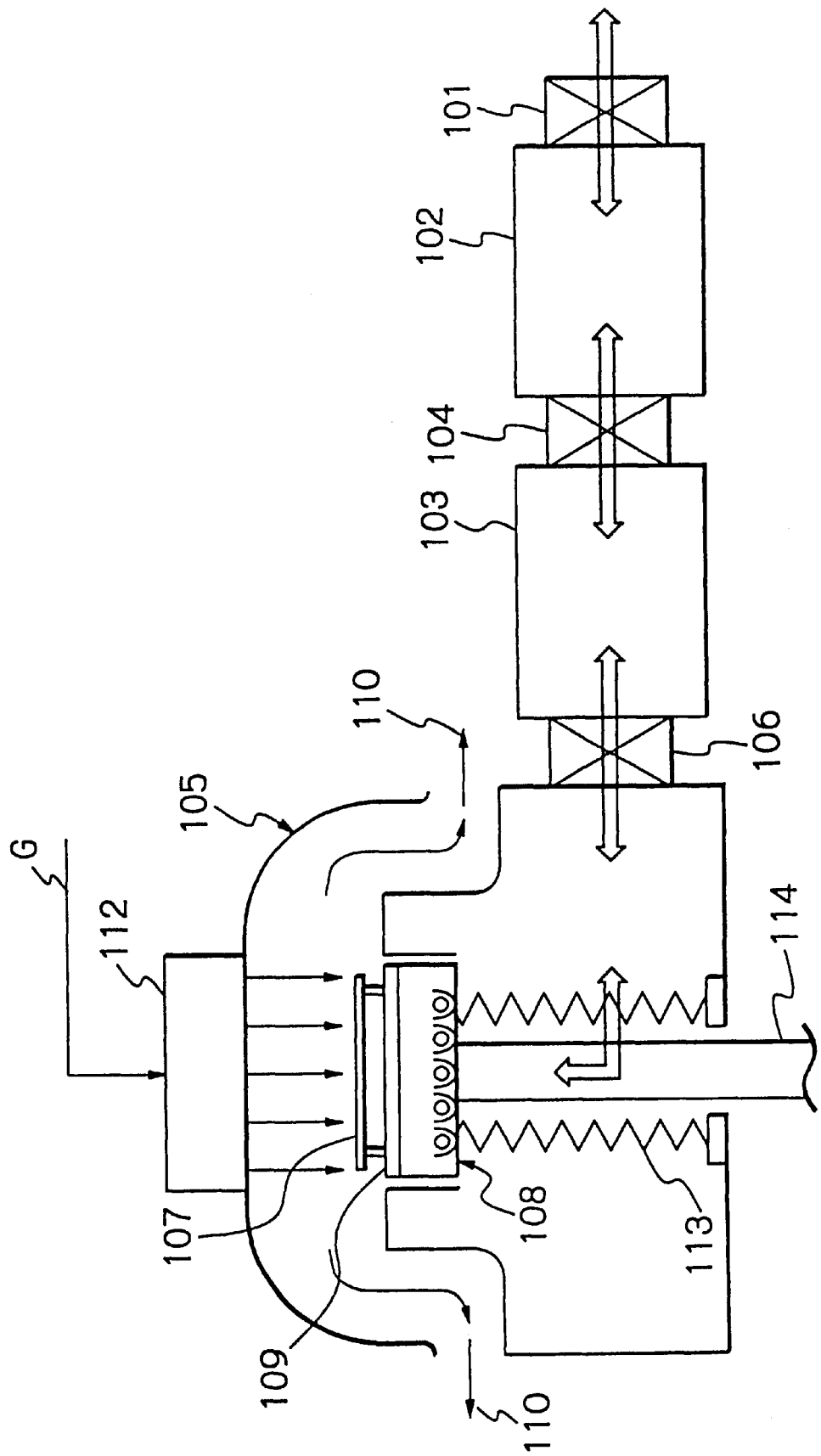
FIG. 2 is a diagram showing an another structural example of a conventional substrate processing apparatus.
Figure 3:
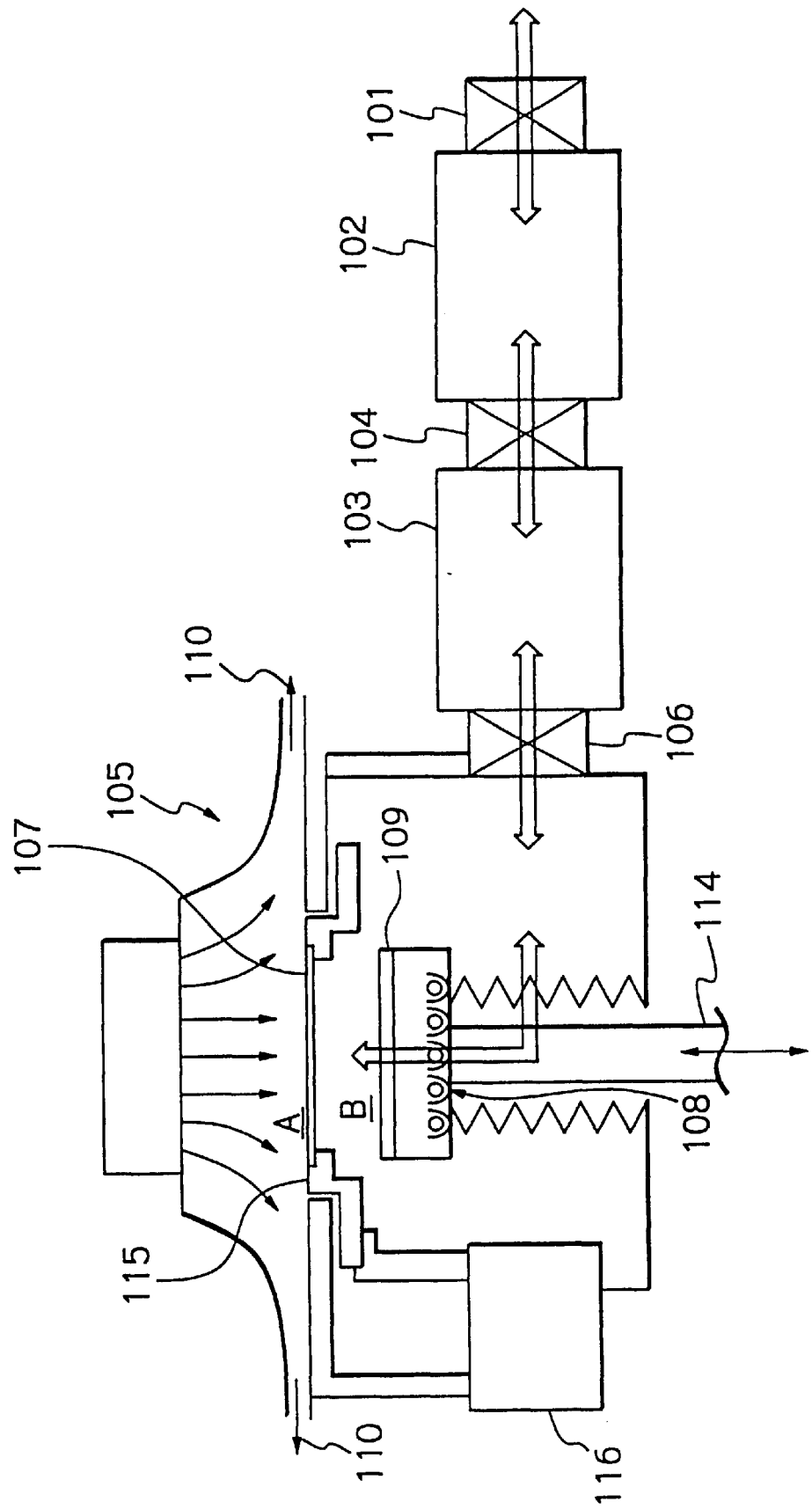
FIG. 3 is a diagram showing still another structural example of a conventional substrate processing apparatus.
Figure 4:
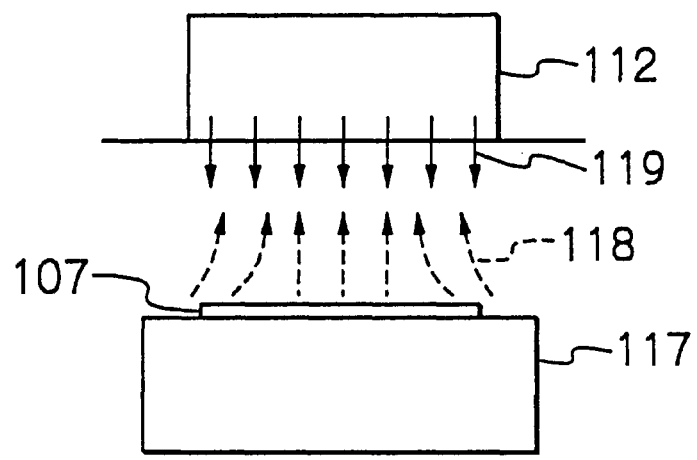
FIG. 4 is a diagram illustrating the processing operation in a substrate processing chamber in which a processing gas supply source is disposed on the upper side, and a heat source is disposed on the lower side.
Figure 5:
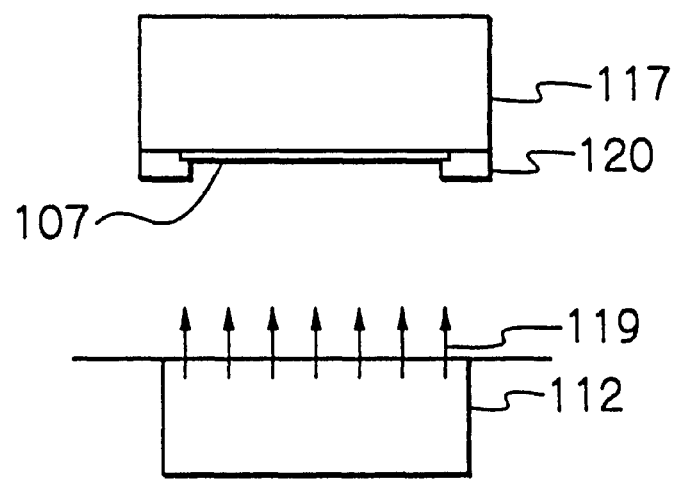
FIG. 5 is a diagram illustrating the processing operation in a substrate processing chamber in which a processing gas supply source is disposed on the lower side, and a heat source is disposed on the upper side.
Figure 6:
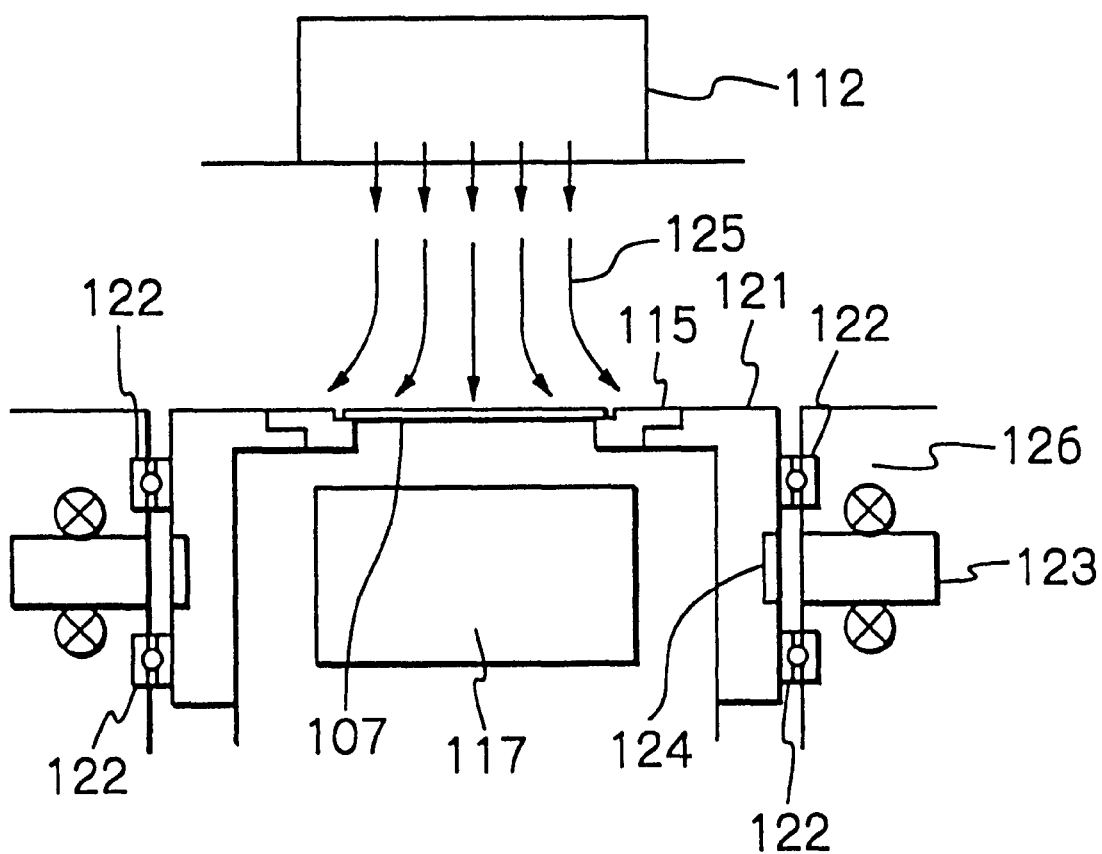
FIG. 6 is a diagram showing a further structural example of a conventional substrate processing apparatus.
Figure 7:
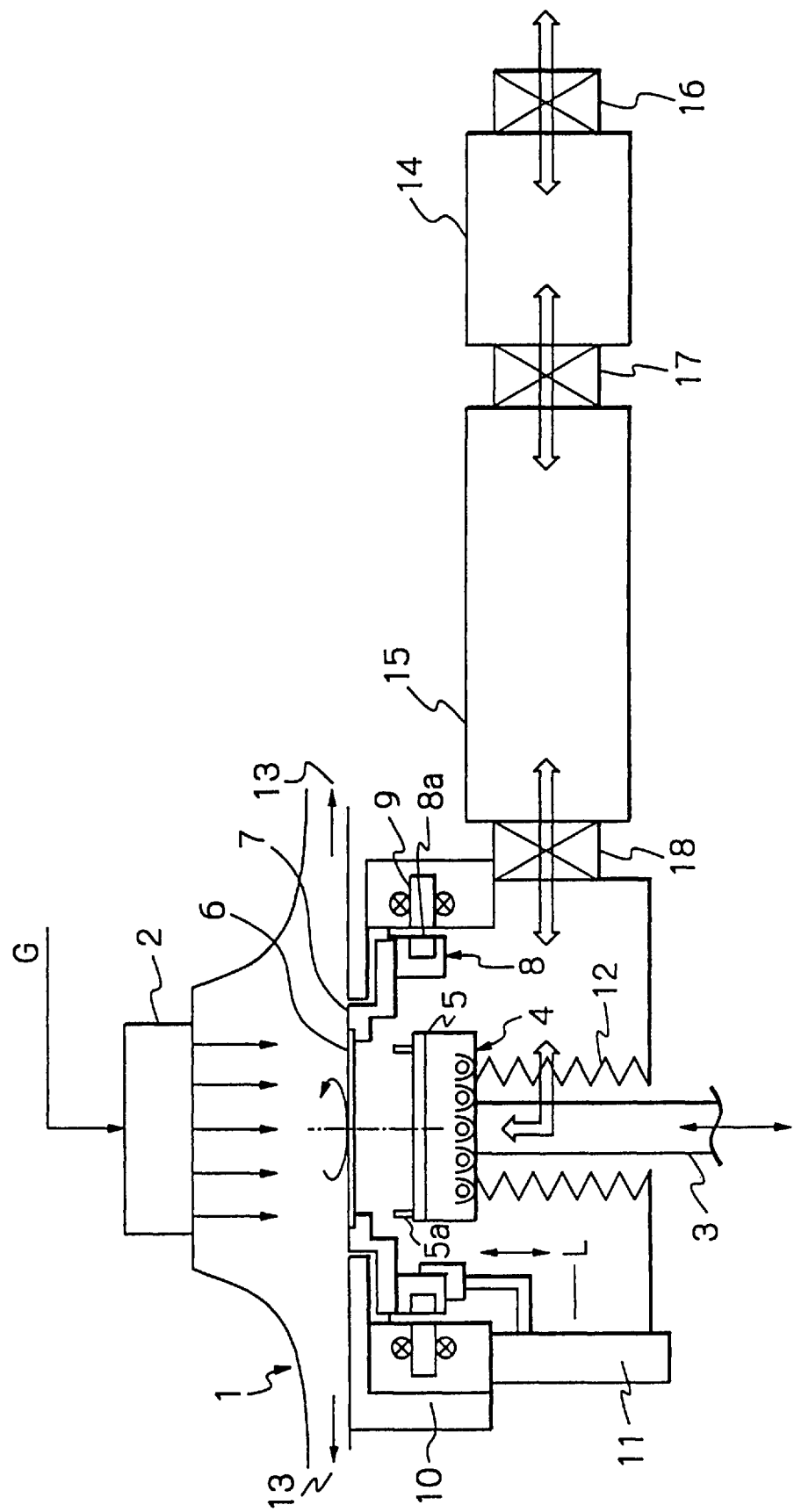
FIG. 7 is a diagram or vertical view showing partially in section a structural example of the substrate processing apparatus according to an embodiment of the present invention.
Figure 8:
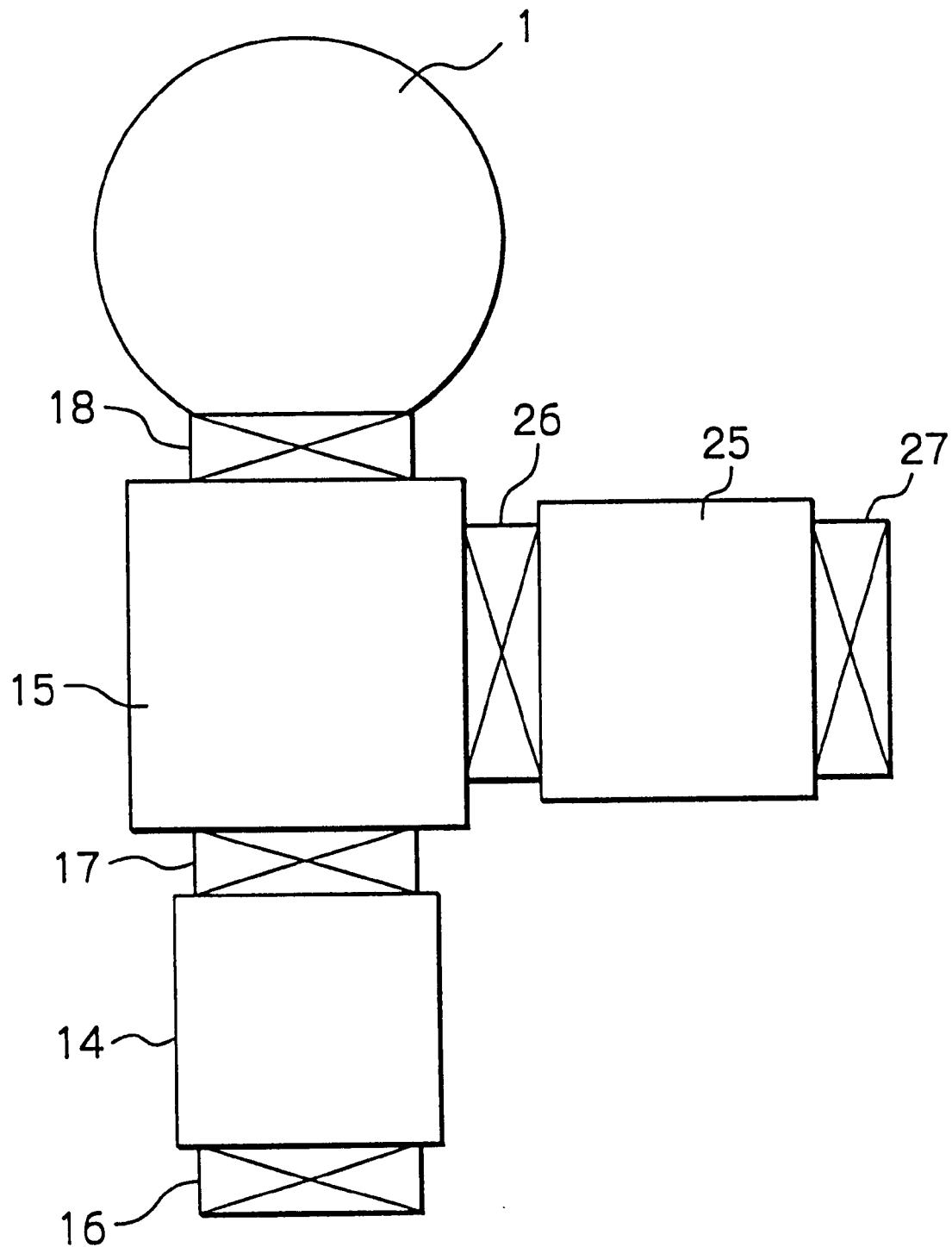
FIG. 8 is a plan view of the substrate processing apparatus shown in FIG. 7.

FIGS. 7 and 8 are diagrams showing a structural example of the substrate processing apparatus according to an embodiment of the present invention. In FIGS. 7 and 8, reference numeral 1 denotes a substrate processing chamber. A processing gas supply unit 2 for supplying a raw material and other gas G is disposed at the upper side of the substrate processing chamber 1. A lamp heater 4 is disposed at the lower side of the substrate processing chamber 1. The lamp heater 4 is secured to the upper end of an elevating shaft 3. The lamp heater 4 is moved up and down by raising and lowering the elevating shaft 3 through an elevating mechanism (not shown). A transparent quartz plate 5 is disposed on the upper side of the lamp heater 4. The upper surface of the transparent quartz plate 5 is provided with a plurality of pins 5a for supporting a substrate 6 when the substrate 6 is loaded into and unloaded from the substrate processing chamber 1.

Reference numeral 7 denotes an annular holder on which the substrate 6 is placed. The holder 7 is placed on an annular rotary member 8 (corresponding to a rotor) at the outer peripheral portion of the lower side of the holder 7. A stationary member 10 is disposed at the outer periphery of the substrate processing chamber 1. The stationary member 10 is provided with a magnetic rotational drive source 9 (corresponding to a stator). Thus, the holder 7 and the substrate 6 can be held at a predetermined position (a position where the upper surface of the stationary member 10 and the surface of the substrate 6 to be processed are flush with each other) due to magnetic coupling between the rotational drive source 9 and the target 8a of the rotary member 8, and that magnetic coupling is provided by a static magnetic force generated by the magnetic rotational drive source 9. In addition, the rotary member 8 can be rotated by a rotating magnetic force generated by the rotational drive source 9.

Reference numeral 11 denotes a holder elevating mechanism for raising and lowering the holder 7 via the rotary member 8. It should be noted that a plurality of holder elevating mechanisms 11 are provided circumferentially spaced from each other (an illustration of the other holder elevating mechanisms 11 is omitted) to support the rotary member 8 at a plurality of points. The holder elevating mechanisms 11 are synchronously operated to raise and lower the holder 7. A bellows 12 is disposed around the outer periphery of the elevating shaft 3. The bellows 12 expands and contracts in response to the up-and-down movement of the elevating shaft 3. Thus, provision of bellows 12 allows the elevating shaft 3 to be located outside the substrate processing chamber 1. In addition, exhaust systems 13 are connected to the substrate processing chamber 1. It should be noted that reference numeral 14 denotes a load-unload chamber, and reference numeral 15 denotes a robot chamber. Also, reference numeral 25 denotes a jig receiving chamber for receiving the holder 7 or holder 7 and the rotary member 8 therein, which will be explained later. Reference numerals 16, 17, 18, 26 and 27 denote gate valves, respectively.

In operation, to load the substrate 6 into the substrate processing chamber 1, the elevating shaft 3 is lowered until the upper surface of the transparent quartz plate 5 is positioned below the level L shown in the figure. Subsequently, the holder 7 and the rotary member 8 are lowered with the holder elevating mechanisms 11 until the upper surface (substrate receiving surface) of the holder 7 reaches the position of level L for receiving the substrate 6 to be loaded into the substrate processing chamber 1 by the robot. At this time, the distal ends of the pins 5a provided on the upper surface of the transparent quartz plate 5 are positioned above the level L by a predetermined distance. When the gate valve 16 is opened, a substrate 6 to be processed is loaded into the load-unload chamber 14. Upon completion of loading, the gate valve 16 is closed, and the load-unload chamber 14 is evacuated. The robot chamber 15 is maintained under a vacuum at all times.

After a pressure in the load-unload chamber 14 has reached a predetermined level, the gate valve 17 between the load-unload chamber 14 and the robot chamber 15 is opened, and the substrate 6 is taken out of the load-unload chamber 14 and moved into the robot chamber 15 by the arm of a robot installed in the robot chamber 15. Thereafter, the gate valve 17 between the robot chamber 15 and the load-unload chamber 14 is closed.

Next, the gate valve 18 between the substrate processing chamber 1 and the robot chamber 15 is opened, and the arm of the robot is extended to load the substrate 6 into the substrate processing chamber 1 and to place the substrate 6 onto the pins 5a provided on the upper surface of the transparent quartz plate 5. Then, the arm of the robot returns to the robot chamber 15, and the gate valve 18 is closed. In this state, the holder 7 and the rotary member 8 are raised by the holder elevating mechanisms 11. Consequently, the substrate 6 is placed on the holder 7, and the substrate 6, together with the holder 7, is further raised to the position illustrated in the figure. At this time, the annular rotary member 8 is held by means of the static magnetic force from the rotational drive source 9. After the rotary member 8 has been held in this way, the holder elevating mechanisms 11 is lowered by a predetermined distance to be separated from the rotary member 8. In addition, the lamp heater 4 is raised to the position illustrated in the figure, and the lamp is lit to heat the substrate 6.

Then, the rotational drive source 9 is activated to generate a rotating magnetic force to rotate the rotary member 8, thereby causing the substrate 6 to rotate about its center axis, together with the holder 7. In this state, the raw material and other gas G are supplied from the processing gas supply unit 2. Although an ascending heat convection is generated by the heated substrate 6 and holder 7, because the substrate 6 and the holder 7 are rotating to cause a pumping effect on the surface of the substrate as stated above, the flow of raw material and other processing gas G supplied downward from the processing gas supply unit 2 toward the substrate 6 overcomes the generated heat convection. Consequently, the processing gas can be smoothly supplied to the surface of the substrate 6, and the processing gas can be smoothly discharged in each sideward direction through the exhaust systems 13.

After processing of the substrate 6 has been completed, the rotation of the rotary member 8 by means of the magnetic force generated by the rotational drive source 9 is terminated and subsequently the lamp heater 4 is lowered to its bottom position by lowering the elevator shaft 3. Then, the holder elevating mechanism 11 is raised to support the holder 7 and the rotational drive source 9 is deenergized to release the magnetic coupling between the rotary member 8 and the rotational drive source 9. Thereafter, the holder 7 supporting the substrate 6 is lowered with the holder elevating mechanism 11 until the upper surface of the holder 7 reaches the position of level L for unloading the substrate 6 from the substrate processing chamber 1 to the load-and unload chamber 15.

The gate valve 18 is opened and the substrate 6 is taken up from the holder 7 and moved from the substrate processing chamber 1 to the robot chamber 15 by the arm of the robot installed in the robot chamber 15. Then, the gate valve 18 is closed and the load-unload chamber 14 is evacuated until the pressure within the load-unload chamber reaches the vacuum level of the robot chamber 15, whereupon the gate valve 17 is opened and the substrate 6 is moved from the robot chamber 15 to the load-unload chamber 14 by the robot installed in the robot chamber 15, and then the gate valve 17 is closed.

After processing of a predetermined number of the substrates 6 in the substrate processing chamber 1 has been conducted, the holder 7 contaminated with deposits of the processing gas G is replaced. For this purpose, the substrate processing chamber 1 and the robot chamber 15 under a vacuum condition are supplied with a clean gas(inert gas) from a clean gas supply source(not shown) to place these chambers under the same pressure filled with the same clean gas. Then, gate valve 18 is opened and the holder 7 within the substrate processing chamber 1 is taken up by the arm of the robot installed in the robot chamber 15 and transferred from the substrate processing chamber 1 to the robot chamber 15 and, then, the gate valve 18 is closed. It should be noted that the holder 7 is not fastened to the rotary member 8, but is simply placed thereon.

Thereafter, a clean gas(inert gas) is supplied to the robot chamber 15 and a jig receiving chamber 25 from the clean gas supply source to place these chambers under the same pressure filled with the same clean gas. Then, the gate valve 26 is opened and the holder 7 held by the robot in the robot chamber 15 is transferred from the robot chamber 15 to the jig receiving chamber 25. A new holder 7 is then taken out from the jig receiving chamber 25 and transferred to the robot chamber 15 by the robot and the gate valve 26 is closed.

Next, a clean gas(inert gas) is supplied to the robot chamber 15 and the substrate processing chamber 1 from the clean gas supply source to place these chambers under the same pressure filled with the same clean gas. Then, the gate valve 18 is opened and the new holder 7 is placed on the predetermined position of the rotary member 8, which is then supported by the holder elevating mechanism 11 at its loading position.

The processing of the substrate 6 in the substrate processing chamber 1 is resumed after the substrate processing chamber 1 is evacuated to a predetermined vacuum level by the exhaust system 13.

On the other hand, the holder 7 received in the jig receiving chamber 25 is taken out from the jig receiving chamber 25 via a gate valve 27 and is subject to a cleaning operation for reuse.

It should be noted that the rotary member 8 can also be loaded into and unloaded from the substrate processing chamber 1 by the robot installed in the robot chamber 15 or by another loading-unloading mechanism (not shown), which is provided separately, to conduct a cleaning operation of the rotary member 8 unloaded from the substrate processing chamber 1. As the rotary member 8 has an annular shape and the holder 7 having a hollow central portion is supported on the annular rotary member 8, the respective central portions of the rotary member 8 and the holder 7 are hollow. Consequently, the lamp heater 4 as a heat source can be disposed in the rotary member 8 under the substrate 6 so as to be parallel to the lower surface of the substrate 6. In addition, the pins 5a for supporting the substrate 6 when it is transferred can be provided on the transparent quartz plate 5.

FIG. 9 is a diagram showing another structural example of a rotative holding mechanism for holding and rotating the holder 7 of the substrate processing apparatus according to the present invention. The rotative holding mechanism has a magnetic levitating member 19 (corresponding to the rotary member 8 in FIG. 7) made of a magnetic material. The holder 7 is incorporated into the upper part of the magnetic levitating member 19. The magnetic levitating member 19 is a cylindrical member having a collar portion 19a formed at the lower end thereof. The collar portion 19a extends horizontally outward. The stationary member 10 is provided with radial magnetic bearings 21 and 22 at upper and lower positions facing the outer periphery of the magnetic levitating member 19. The magnetic rotational drive source 9 is provided between the upper and lower radial magnetic bearings 21 and 22. An axial magnetic bearing 20 is disposed at a position facing the upper surface of the collar portion 19a.

The radial magnetic bearing 21 comprises an electromagnet 21a and a displacement sensor 21b. The radial magnetic bearing 22 comprises an electromagnet 22a and a displacement sensor 22b. The axial magnetic bearing 20 comprises an electromagnet 20a and a displacement sensor 20b. A can 23 made of a non-magnetic material covers the respective surfaces of the electromagnet 21a and displacement sensor 21b of the radial magnetic bearing 21, the rotational drive source 9, the electromagnet 22 a and displacement sensor 22b of the radial magnetic bearing 22 and the electromagnet 20a and displacement sensor 20b of the axial magnetic bearing 20. Consequently, the surfaces of the electromagnets 21a, 22 a and 20a, the displacement sensors 21b, 22b and 20b and the rotational drive source 9 are prevented from coming into contact with the processing gas and do not corrode. The surface of the stationary member 10 that is exposed in the substrate processing chamber 1 is covered with a quartz cover 24 to prevent contamination by the low material and other processing gas G.

In the rotative holding mechanism arranged as stated above, the assembly of the magnetic levitating member 19 and the holder 7 is adapted to be raised and lowered by holder elevating mechanisms (not shown) as in the case of FIG. 7. When the assembly of the magnetic levitating member 19 and the holder 7 is raised to a position shown in FIG. 8 by the holder elevating mechanisms, the radial magnetic bearings 21 and 22 and the axial magnetic bearing 20 are activated to support the magnetic levitating member 19 in a levitational manner at the position illustrated in the figure.

In a general use of the conventional axial magnetic bearing, electromagnets are disposed at the upper and lower sides of a bearing target of a magnetic levitating member. In the axial magnetic bearing 20 of the invention, however, the electromagnet 20a is provided only at the upper side, and the magnetic levitating member 19 is supported in a levitational manner by the balance of the magnetic force of the electromagnet 20a and the gravitational force acting on the holder 7 and the magnetic levitating member 19. Accordingly, when no magnetic force is being generated by the electromagnets 21a and 22a of the radial magnetic bearings 21 and 22 and the rotational drive source 9 as well as the electromagnet 20a of the axial magnetic bearing 20, the assembly of the holder 7 and the magnetic levitating member 19 can be lowered by the holder elevating mechanisms.

Therefore, loading and unloading of the holder 7 or holder 7 and the magnetic levitating member 19 into and out of the substrate processing chamber of this embodiment can readily be conducted without disassembling the substrate processing apparatus in a manner similar to that explained with respect to the first embodiment.

The gap between the stationary member 10 and the magnetic levitating member 19 is detected with the displacement sensors 21b and 22b of the radial magnetic bearings 21 and 22 and the displacement sensor 20b of the axial magnetic bearing 20. With the outputs of these displacement sensors, the exciting currents of the electromagnets 21a, 22a and 20a are controlled to support the assembly of the holder 7 and the magnetic levitating member 19 in a levitational manner at a predetermined position as in the case of the conventional magnetic bearings. Furthermore, the magnetic levitating member 19 is supported by the magnetic bearings and rotated by a rotating magnetic force generated from the rotational drive source 9. Consequently, the holder 7 rotates together with the substrate 6. Loading and unloading of the substrate 6 are the same as in the substrate processing apparatus shown in FIG. 7. Therefore, a description thereof is omitted.

The extent of heat convection produced by heating with the lamp heater 4 as a heat source depends on process parameters, i.e. temperature, molecular weight of gas, pressure, etc. In addition, the uniformity of the processed surface of the substrate 6 and the processing speed differ according to the magnitude of the pumping effect produced by rotation of the substrate 6 and the holder 7. The processing speed also differs according to the kind of reaction precursor. Accordingly, the rotational speed at which the above-described effects can be produced by rotation of the substrate 6 and the holder 7 varies depending on the above-described parameters. In a semiconductor manufacturing process, however, the area of the substrate 6 and the processing gas flow rate are in proportional relation to each other, and the pumping effect produced by rotation of the substrate 6 and the holder 7 and the size of the substrate 6 are also in proportional relation to each other. In view of these matters, the substrate 6 should preferably be rotated at about 50 to 150 rpm to cope with the problem of the ascending current (heat convection) generated from the upper surface of the substrate 6.

In FIG. 9, a lamp heater (not shown) is disposed in the hollow portion of the magnetic levitating member 19 as a heat source. Therefore, the magnetic levitating member 19 has a large diameter. Accordingly, when the magnetic levitating member 19 is rotated, the peripheral speed at the outer peripheral portion of the magnetic levitating member 19 is high. Therefore, supporting the magnetic levitating member 19 with the magnetic bearings as shown in FIG. 9 (i.e. the radial magnetic bearings 21 and 22 and the axial magnetic bearing 20) is also favorable from the viewpoint of preventing the generation of particles.

As has been stated above, according to the present invention, it is possible to obtain the advantageous effects as stated below.

According to a first aspect of the invention, when a substrate is processed in a reaction space where a processing gas is present under a vacuum such as exists in a substrate processing chamber, the substrate is levitated by the magnetic force source during processing. Consequently, the apparatus is free from problems such as the generation of particles. In addition, because the holder can be held and released according to whether or not there is a magnetic coupling force from the magnetic force source, it becomes easy to perform the operation of holding and releasing the holder, and it also becomes easy to load and unload the holder into and from the substrate processing chamber. Accordingly, it becomes easy to carry out replacement of the holder and cleaning to remove a deposit formed thereon.

According to a second aspect of the invention, the holder is levitated and rotated by the magnetic force source. Consequently, a pumping effect produced by the rotation of the holder allows a flow of a processing gas descending toward the substrate to overcome the ascending current (heat convection) produced by heating. Accordingly, the processing gas reaches the substrate surface smoothly. Thus, efficient substrate processing can be realized.

According to a third aspect of the invention, only when the substrate is move to a predetermined position for processing, the magnetic levitating member supporting the holder is magnetically coupled to the magnetic force source. Therefore, when processing is not being carried out, the magnetic levitating member can freely move into or out of the substrate processing chamber. Accordingly, it becomes easy to perform the substrate loading-unloading operation and cleaning as well as replacement of the holder and the levitating member.

According to a fourth aspect of the invention, the magnetic levitating member is supported in a levitational manner by the magnetic bearing and rotated by the magnetic rotational drive source. Therefore, it is possible to stably perform levitational support control and rotation control of the magnetic levitating member, even if it has a large diameter and rotates at a high peripheral speed.

What is claimed is:

1. A substrate processing apparatus comprising:
   a substrate processing chamber;
   a robot mechanism for loading and unloading a substrate into and out of said substrate processing chamber;

a substrate heating source provided in said substrate processing chamber; and a raw material supply source having a supply surface arranged to face a surface of the substrate to be processed, said raw material supply source being operable to supply a raw material from said supply surface toward the substrate for processing the substrate;

a holder for supporting the substrate, said holder being adapted to be held at a processing position in said substrate processing chamber such that a space in said substrate processing chamber is divided by said holder and the substrate supported by said holder into an upper space for serving as a reaction space to process the substrate and a lower space for accommodating said substrate heating source; and a magnetic force source for holding said holder at the processing position in a levitational manner by generating a magnetic force during processing of the substrate, and for releasing said holder when not generating the magnetic force so as to allow removal of said holder from said substrate processing chamber.

2. The apparatus of claim 1, wherein said magnetic force source is operable to rotate said holder about a central axis of the substrate supported by said holder during processing of the substrate.

3. The apparatus of claim 2, further comprising an annular magnetic levitating member for supporting said holder, said magnetic levitating member being magnetically coupled to said magnetic force source only when said holder is moved to the processing position for processing of the substrate.

4. The apparatus of claim 3, wherein said magnetic force includes:

magnetic bearings operable to support said magnetic levitating member in a levitational manner; and a rotational drive source operable to rotate said magnetic levitating member by generating a magnetic force.

5. The apparatus of claim 1, further comprising an annular magnetic levitating member for supporting said holder, said magnetic levitating member being magnetically coupled to said magnetic force source only when said holder is moved to the processing position for processing of the substrate.

6. The apparatus of claim 5, wherein said magnetic force source includes:

magnetic bearings operable to support said magnetic levitating member in a levitational manner; and a rotational drive source operable to rotate said magnetic levitating member by generating a magnetic force.

7. The apparatus of claim 1, wherein said holder, said robot mechanism, substrate processing chamber, and said magnetic force source are arranged such that said robot mechanism is operable to remove said holder from said substrate processing chamber when no magnetic force is generated by said magnetic force source.

8. The apparatus of claim 1, further comprising a holder elevating mechanism operable to move said holder in a vertical direction within said substrate processing chamber between the processing position and a removal position.

9. The apparatus of claim 8, further comprising an elevating shaft operable to move said substrate heating source in a vertical direction within said substrate processing chamber.

10. The apparatus of claim 8, further comprising an annular magnetic levitating member for supporting said holder, said magnetic levitating member being magnetically coupled to said magnetic force source only when said holder is moved to the processing position by said holder elevating mechanism.

11. The apparatus of claim 10, wherein said magnetic force source includes:

magnetic bearings operable to support said magnetic levitating member in a levitational manner; and a rotational drive source operable to rotate said magnetic levitating member by generating a magnetic force.

12. The apparatus of claim 10, wherein said annular magnetic levitating member is arranged in said substrate processing chamber so as to be freely moveable when said magnetic force source is not generating the magnetic force.

13. The apparatus of claim 1, wherein said holder is adapted to be moved within said substrate processing chamber and adapted to be freely movable when not in the processing position.

* * * * *